(12) United States Patent
Prajuckamol et al.

(10) Patent No.: US 10,861,767 B2
(45) Date of Patent: Dec. 8, 2020

(54) PACKAGE STRUCTURE WITH MULTIPLE SUBSTRATES

(71) Applicant: SEMICONDUCTOR COMPONENTS INDUSTRIES, LLC, Phoenix, AZ (US)

(72) Inventors: Atapol Prajuckamol, Klaeng (TH); Chee Hiong Chew, Seremban (MY); Yushuang Yao, Shenzhen (CN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 17 days.

(21) Appl. No.: 15/993,169

(22) Filed: May 30, 2018

(65) Prior Publication Data

US 2019/0348342 A1    Nov. 14, 2019

Related U.S. Application Data

(60) Provisional application No. 62/670,506, filed on May 11, 2018.

(51) Int. Cl.
| | |
|---|---|
| *H01L 23/373* | (2006.01) |
| *H01L 23/055* | (2006.01) |
| *H01L 21/48* | (2006.01) |
| *H01L 23/538* | (2006.01) |

(52) U.S. Cl.
CPC ...... *H01L 23/3735* (2013.01); *H01L 21/4817* (2013.01); *H01L 21/4875* (2013.01); *H01L 23/055* (2013.01); *H01L 23/5381* (2013.01)

(58) Field of Classification Search
None
See application file for complete search history.

(56) References Cited

U.S. PATENT DOCUMENTS

| | | | |
|---|---|---|---|
| 9,443,792 B1* | 9/2016 | Spann | H01L 24/48 |
| 2010/0170706 A1 | 7/2010 | Kimmich et al. | |
| 2016/0351468 A1* | 12/2016 | Liang | H01L 24/33 |
| 2017/0162468 A1* | 6/2017 | Ko | H01L 23/3735 |
| 2019/0103402 A1* | 4/2019 | Tsuchimochi | H01L 27/0761 |
| 2019/0131217 A1* | 5/2019 | Asai | H01L 23/49562 |

* cited by examiner

*Primary Examiner* — Thien F Tran
(74) *Attorney, Agent, or Firm* — Brake Hughes Bellermann LLP

(57) ABSTRACT

Example implementations relate to an electronic module can include a first direct bonded metal (DBM) substrate, a second DBM substrate, a housing member, and a plurality of connection terminals. The first DBM substrate and second DBM substrate can be aligned along a same plane. The housing member can be coupled to the first substrate and the second substrate and the housing member can include a plurality of openings in a surface of the housing member. The plurality of connection terminals can be electrically coupled to at least one of the first DBM substrate and the second DBM substrate, in which a connection terminal from the plurality of terminals can extend through an opening from the plurality of openings of the housing member.

20 Claims, 14 Drawing Sheets

PACKAGE STRUCTURE WITH MULTIPLE SUBSTRATES

RELATED APPLICATION

This application claims priority to and the benefit of U.S. Provisional Application No. 62/670,506 filed on May 11, 2018, which is incorporated by reference herein in its entirety.

FIELD

This relates, generally, to an electronic module, and in particular, an electronic module having multiple substrates.

BACKGROUND

Electronic modules can have a predetermined size and shape. Accordingly, the components that can be used within the electronic modules can be limited. Thus, a need exists for systems, methods, and apparatus to address the shortfalls of present technology and to provide other new and innovative features.

SUMMARY

In a general aspect, an electronic module can include a first direct bonded metal (DBM) substrate, a second DBM substrate, a housing member, and a plurality of connection terminals. The first DBM substrate and second DBM substrate may be aligned along a same plane. The housing member may be coupled to the first substrate and the second substrate and the housing member may include a plurality of openings in a surface of the housing member. The plurality of connection terminals may be electrically coupled to at least one of the first DBM substrate and the second DBM substrate, in which a connection terminal from the plurality of terminals may extend through an opening from the plurality of openings of the housing member.

DETAILED DESCRIPTION

The electronic modules (e.g., power integrated modules (PIMs)) described herein can be used to provide or switch power to electronic components or devices in many technical fields. One component used in the electronic modules described herein are direct bonded metal (DBM) substrates (e.g., a direct bonded copper (DBC)), which can be configured to provide interconnections to form an electric circuit. DBM substrates can be used in power modules because they have low coefficient of thermal expansion to ensure desirable thermal cycling performance. DBM substrates also have excellent electrical insulation and desirable heat spreading characteristics.

The configurations described herein can include multiple DBM substrates within a single electronic module. Accordingly, the type (and function) of a DBM substrate that can be used in an electronic module is not limited. The configurations described herein allow for varied designs without limitation for a certain size of DBM substrate that can be utilized (e.g., coupled within the housing member).

Figure 1A:
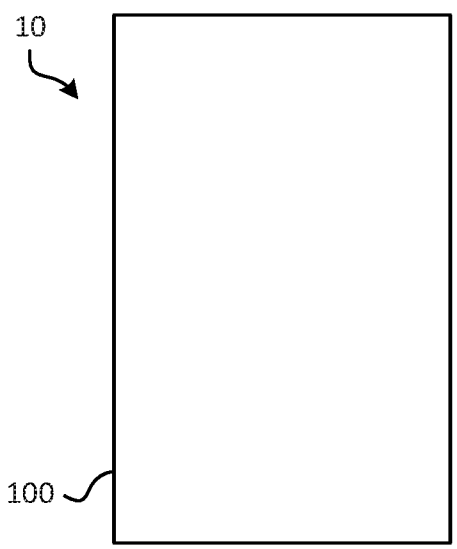
FIGS. 1A through 1C are various views of an electronic module, in accordance with implementations described herein.
Figure 1B:
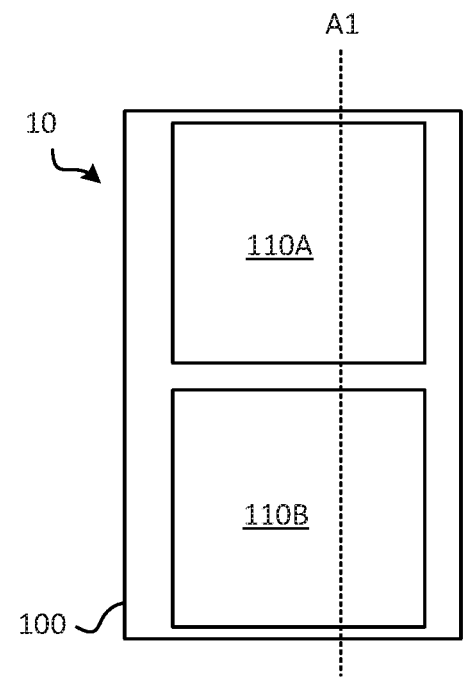
Figure 1C:
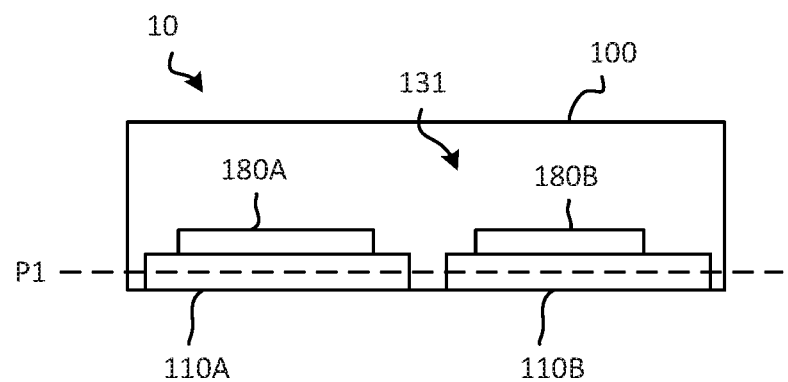

FIGS. 1A-1C illustrate schematic drawings of an exemplary electronic module 10 according to example implementations. FIG. 1A is a top view of the electronic module 10; FIG. 1B is a bottom view of the electronic module 10; and FIG. 1C is a cross-sectional view of the electronic module 10 cut along line A1 shown in FIG. 1B.

As shown in FIG. 1A, the electronic module 10 may include a housing 100. In some implementations, the housing 100 may be made from a molding material, such as, a thermosetting material or an elastomer material. In some implementations, the housing 100 may be formed by, for example, an injection molding process.

As shown in FIGS. 1B and 1C, the electronic module 10 may include a first DBM substrate 110A and a second DBM substrate 110B coupled to the housing 100. In some implementations, the first DBM substrate 110A and/or the second DBM substrate 110B are at least partially disposed in the housing 100. In some implementations, the first DBM substrate 110A and/or the second DBM substrate 110B are at least partially disposed outside of the housing 100. In some implementations, the first DBM substrate 110A and/or the second DBM substrate 110B may be mechanically coupled to the housing 100. In some implementations, the first DBM substrate 110A and/or the second DBM substrate 110B may be coupled to the housing 100 with an adhesive (e.g., a glue), and/or so forth.

In some implementations, the first DBM substrate 110A and/or the second DBM substrate 110B may be a direct bonded copper (DCB) substrate. In some implementations, the first DBM substrate 110A and/or the second DBM substrate 110B may be a direct bonded aluminum (DCA) substrate or an active metal braze (AMB) substrate. Although not shown in FIGS. 1A through 1C, in some implementations, one or more of the DBM substrates 110A, 110B can include a dielectric layer disposed between two metal layers. In some implementations, one or more of the metal layers can be patterned and can include electrical traces.

As shown in FIG. 1C, the housing 100 includes a cavity 131. Although not shown in FIG. 1C, in some implementations, the housing 100 includes more than one cavity. In some implementations, the housing 100 can define more than one cavity.

In this implementation, semiconductor die 180A and 180B can be coupled (e.g., electrically coupled), respectively, to the DBM substrates 110A, 110B. In some implementations more or less than one semiconductor die can be coupled to one or more of the DBM substrates 110A, 110B. The semiconductor die 180A, 180B can be disposed within the cavity 131. In some implementations, one or more of the semiconductor die 180A, 180B can be a power semiconductor die. In some implementations, one or more of the semiconductor die 180A, 180B can include a vertical metal oxide semiconductor field effect transistor (MOSFET)

device, a bipolar junction transistor (BJT) device, a diode device, an application-specific integrated circuit (ASIC), passive components (e.g., resistors, capacitors, inductors), and/or so forth.

In some implementations, the first DBM substrate 110A and the second DBM substrate 110B may be disposed adjacent (e.g., side-by-side, lateral) to each other. In other words, the first DBM substrate 110A and the second DBM substrate 110B may be aligned along the same plane (plane P1) (e.g., same horizontal plane, a bottom surface of each DBM substrate is level and along the same plane). In some implementations, the first DBM substrate 110A and the second DBM substrate 110B may be aligned within the same plane (e.g., aligned so that the DBM substrates 110A, 110B intersect and are aligned within the same horizontal plane).

Although not shown, in some implementations, the first DBM substrate 110A and the second DBM substrate 110B may be aligned along the same direction within different planes. For example, the first DBM substrate 110A may be aligned along a first plane parallel to a second plane along which the second DBM substrate 110B is aligned.

The configurations within the electronic module 10 of the first and second DBM substrates 110A, 110B reduces size and weight compared to conventional electronic modules and offers higher reliability, efficiency and power density for improved performance. It also provides simpler repairs, maintenance, and design. In addition, the number of manufacturing steps of producing the electronic module can be reduced.

In some implementations, each of the DBM substrates 110A, 110B includes the plurality of connection terminals 120 electrically coupled thereto. In some implementations, the plurality of connection terminals 120 may be coupled (e.g., attached, soldered) to a surface (e.g., top) of the first DBM substrate 110A and the second DBM substrate 110B. In some implementations, the plurality of connection terminals 120 may extend within a cavity of the housing 100. More specifically, the plurality of connection terminals 120 extend upwards toward the top surface 117 of the housing 100. In some implementations, the plurality of connection terminals 120 may extend in a same direction (e.g., connection terminals extending in a parallel direction with respect to other connection terminals). In some implementations, the plurality of connection terminals 120 may extend in different directions (e.g., connection terminals extending in an non-parallel (e.g., orthogonal) direction with respect to other connection terminals).

Figure 2A:
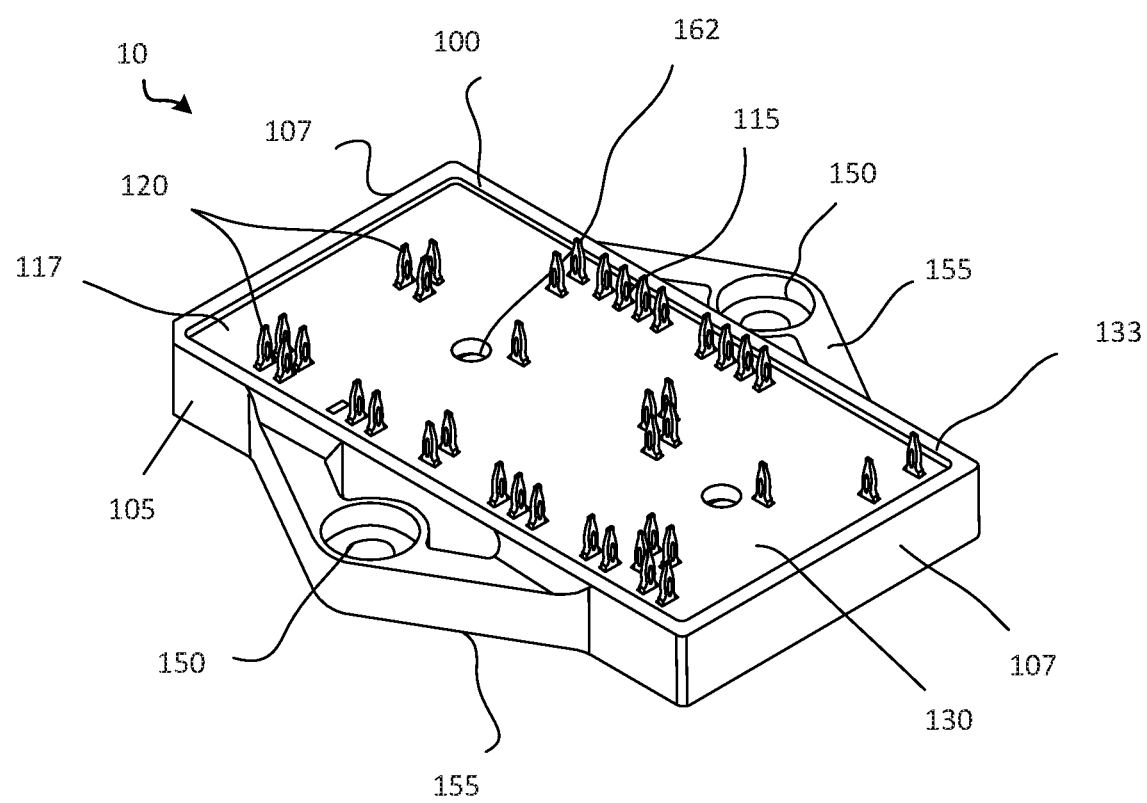
FIGS. 2A through 2I, 2K and 2L are various views of an electronic module according to another example implementation.
Figure 2B:
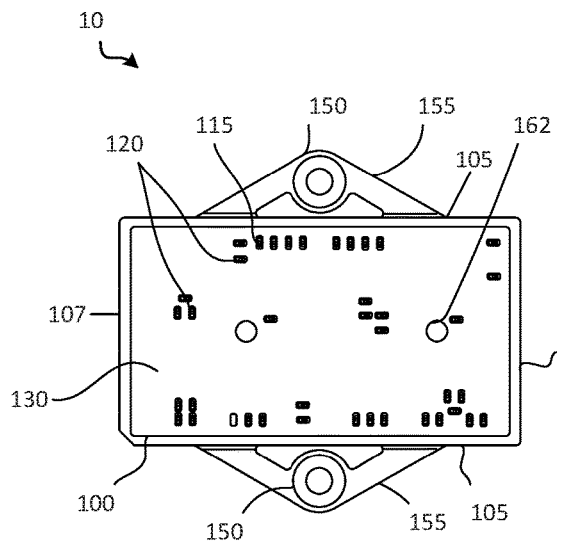
Figure 2C:
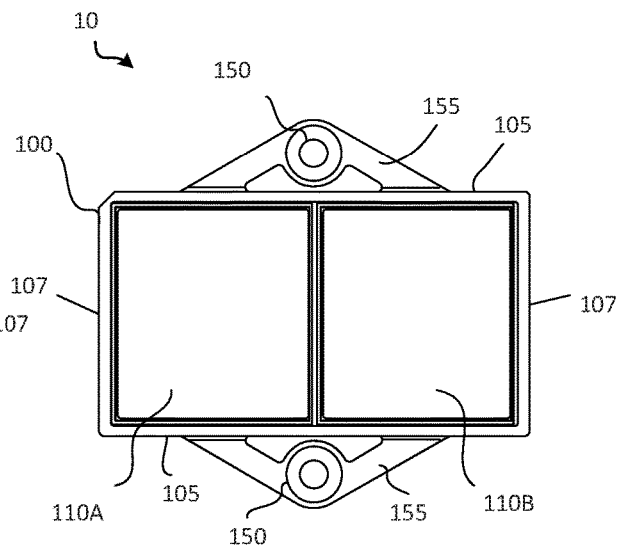
Figure 2D:
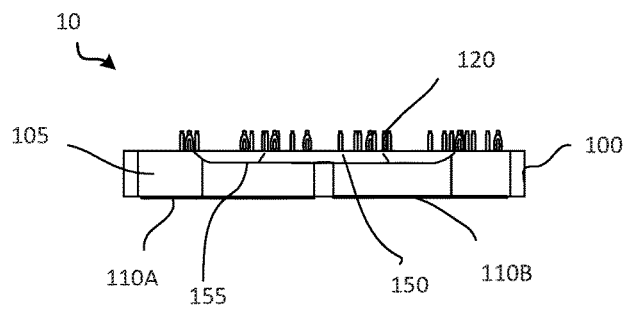
Figure 2E:
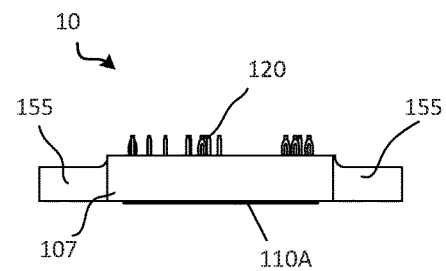
Figure 2F:
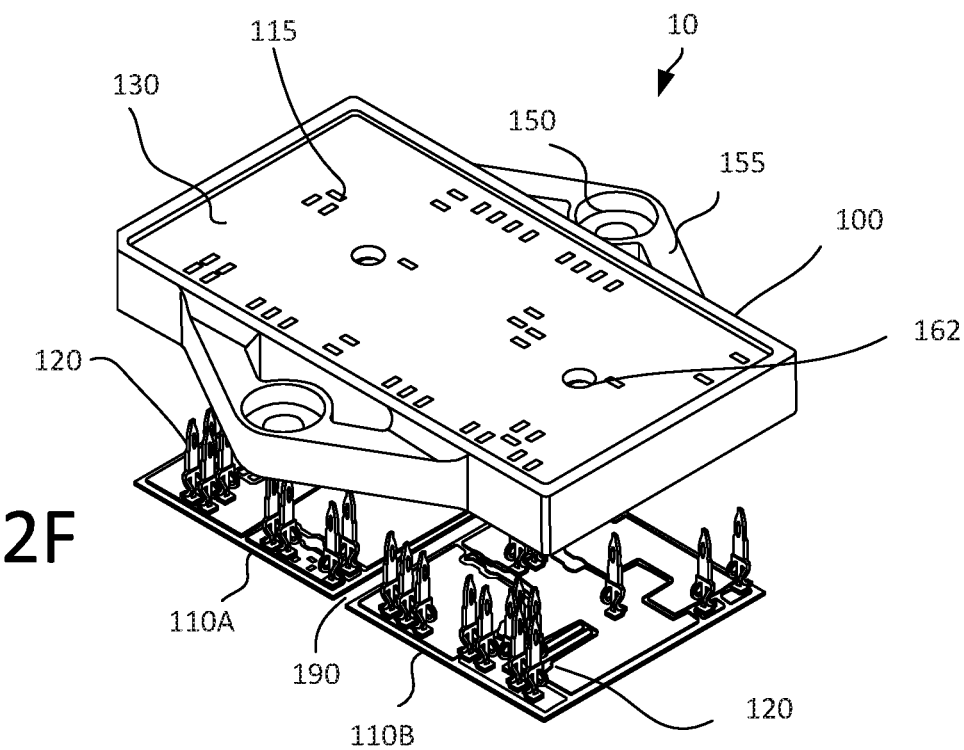
Figure 2G:
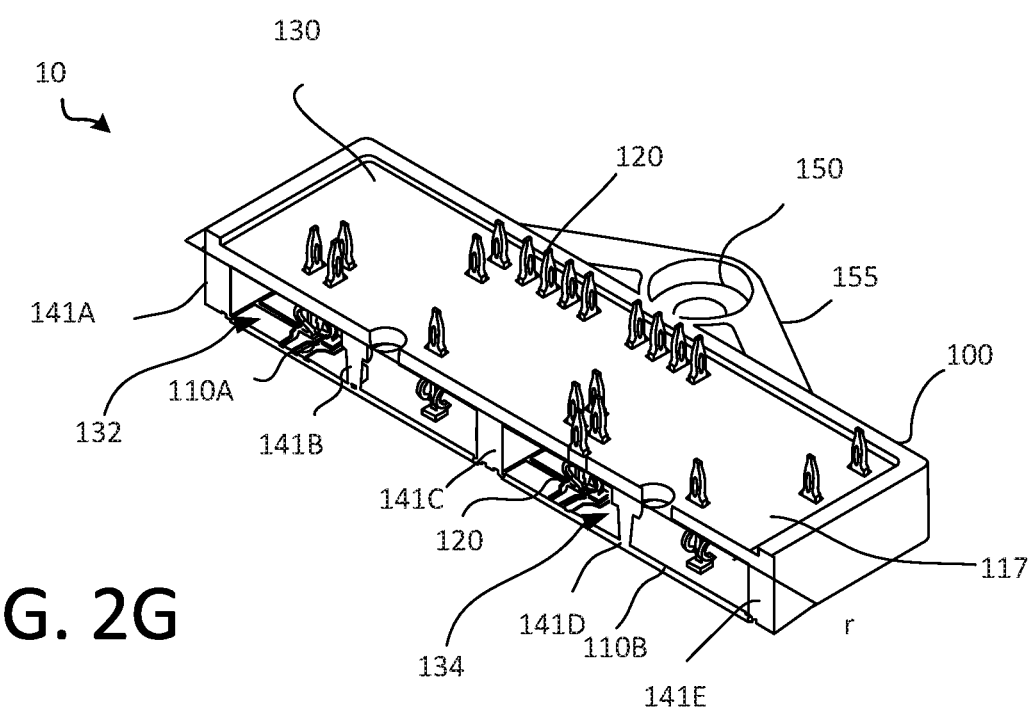
Figure 2H:
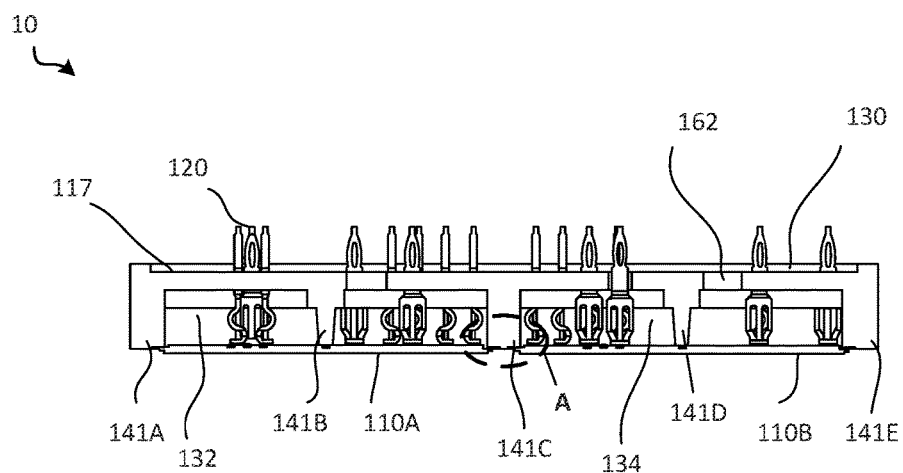
Figure 2I:
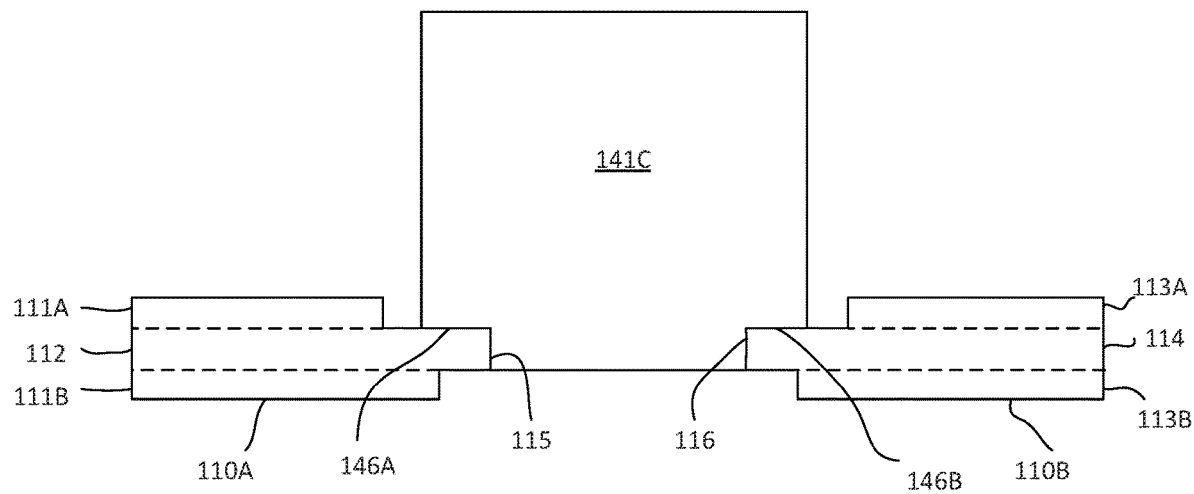

FIGS. 2A-2H illustrate an electronic module 10 according to example implementations. The electronic module 10 shown in FIGS. 2A-2H is a variation of the electronic module shown in FIGS. 1A through 1C. FIG. 2A is a perspective view of the electronic module 10 (without a base plate); FIG. 2B is a top view of the electronic module 10 of FIG. 2A; FIG. 2C is a bottom view of the electronic module 10 of FIG. 2A; FIG. 2D is a side view, when viewed from a long side of an example electronic module of FIG. 2A; FIG. 2E is a side view, when viewed from a short side of the electronic module 10 of FIG. 2A; FIG. 2F is an exploded view of the electronic module 10 of FIG. 2A; FIG. 2G is a half portion cut view of the electronic module 10 of FIG. 2A; FIG. 2H is a cross sectional view of the electronic module 10 of FIG. 2G; and FIG. 2I is an enlarged view of an area associated with portion A shown in FIG. 2H.

Referring to FIG. 2A, the electronic module 10 includes a housing 100. In some implementations, the housing 110 may be generally rectangular shape having two long sides 105 and two short sides 107. The housing 100 may be other shapes, such as, for example, a square. The housing 100 may include a plurality of openings 115 at a surface 117 (e.g., top surface) of the housing 100. The plurality of openings 115 may receive a plurality of connection terminals 120 (also can be referred to as connection pins) such that each of the plurality of connection terminals 120 extends through the respective openings 115 and extends above (e.g., over) the surface 117 of the housing 100. These connection terminals 120 can be used to electrically connect with a device (e.g., a printed circuit board (PCB), an electronic component) (not shown) exterior to the electronic module 10.

In some implementations, the surface 117 of the housing 100 may include a recess 130. The recess 130 may be formed such that the recess 130 is deep enough to accommodate a device (not shown) mounted thereon. Further, the recess 130 can be used to secure the device mounted on the housing 100. In other words, sidewalls 133 formed by (surrounding) the recess 130 prevents the device from moving or sliding.

In some implementations, the housing 100 may include a countersink hole 150 for receiving a fastening member (e.g., screw). In some implementations, the countersink hole 150 may be disposed at least on the long side (e.g., longitudinal side) 105 of the housing 100. In some implementations, the countersink hole 150 may be disposed at both long sides 107 of the housing 100. The countersunk hole 150 helps relieve stress when tightening via screws. In some implementations, a flat washer (not shown) may be used in the countersunk hole 150 to prevent slack.

In some implementations, the countersink hole 150 may be disposed on an extension member 155 extending from the housing 100. In some implementations, the extension member 155 may extend from both long sides 105 of the housing 100. In some implementations, the extension member 155 can be integrally molded with the housing 100.

In some implementations, the housing 100 may include a through-hole 162. In some implementation, at least two through-holes 162 (or more) are defined within the surface 117 of the housing 100. The through-hole 162 may help, or allow, transfer heat out the housing 100 (e.g., a cavity of the housing 100) from, for example, one or more semiconductor devices disposed therein.

Referring to FIG. 2F, the electronic module 10 may further include a first DBM substrate 110A (e.g., a direct bonded copper (DBC) substrate) and a second DBM substrate 110B (e.g., a direct bonded copper (DBC) substrate). The housing 100 may encapsulate the first DBM substrate 110A and the second DBM substrate 110B, and/or other devices and/or components (e.g., semiconductor die) (not shown).

In some implementations, the plurality of connection terminals 120 can each be any type of suitable connection terminal, such as, for example, a snap-in terminal, a press-fit terminal, a spring terminal, an interlocking terminal having similar mechanical and electrical functionalities and/or so forth.

Referring to FIG. 2G, the housing 100 may include a first cavity 132 and a second cavity 134 defined within the housing 100. The first cavity 132 may correspond with the first DBM substrate 110A and the second cavity 134 may correspond with the second DBM substrate 110B. The cavities 132, 134 have a sufficient size or dimension to include at least a portion of the DBM substrates 110A, 110B, respectively. Each of the cavities 132, 134 can have a sufficient size or dimension to include one or more semiconductor die (not shown).

As shown in FIGS. 2G and 2H, the housing 100 may further include a plurality of pillars 141A, 141B, 141C, 141D and 141E extending toward the first DBM substrate 110A and the second DBM substrate 110B. The pillars 141A, 141E can define walls of the housing 100. The pillar 141C can define a wall (e.g., an inner wall) within the housing 100. The pillar 141A (or wall) and the pillar 141C (or inner wall) can be contiguous parts of the same wall that define the cavity 132. The pillar 141E (or wall) and the pillar 141C (or inner wall) can be contiguous parts of the same wall that define the cavity 134.

The plurality of pillars 141A, 141B, 141C, 141D and 141E may be aligned along a direction perpendicular to the surface 117 of the housing 100 (and/or the DBM substrates 110A, 110B). One or more of the plurality of pillars 141A, 141B, 141C, 141D and 141E may be aligned along a direction perpendicular to the surface 117 of the housing 100 to provide structural support. In addition to the plurality of pillars 141A, 141B, 141C, 141D, 141E acting as support members, one or more of the plurality of pillars 141A, 141B, 141C, 141D, 141E may also form at least a portion of one or more of the cavities 132, 134. For example, pillar 141A and pillar 141C can define at least a portion of the first cavity 132, and pillar 141E and pillar 141C can define at least a portion of the second cavity 134.

In some implementations, at least one of the plurality of pillars 141A, 141B, 141C, 141D, 141E may be in contact with, or may support, one or more of the DBM substrates 110A, 110B. For example, pillars 141A, 141B and 141C are in contact with a surface of the first DBM substrate 110A. The pillars 141A and 141C are in contact with perimeter portions of the first DBM substrate 110A and the pillar 141B is in contact with a middle portion of the first DBM substrate 110A. Similarly, pillars 141C, 141D and 141E are in contact with a surface of the second DBM substrate 110B. The pillars 141C and 141E are in contact with perimeter portions of the second DBM substrate 110B and the pillar 141D is in contact with a middle portion of the second DBM substrate 110B.

As shown in FIG. 2H, the pillar 141C is in contact with both of the first DBM substrate 110A and the second DBM substrate 110B. In some implementations, the plurality of pillars 141A, 141B, 141C, 141D, 141E may be glued or soldered to the first DBM substrate 110A and/or the second DBM substrate 110B.

Referring to FIG. 2I, which is an enlarged view of an area associated with portion A shown in FIG. 2H, pillar 141C contacts both the first DBM substrate 110A and the second DBM substrate 110B. In some implementations, pillar 141C may include a first recess 146A and a second recess 146B. The first recess 146A may be configured to receive a portion of the first DBM substrate 110A and the second recess 146B may be configured to receive a portion of the second DBM substrate 110B.

In some implementations, the first DBM substrate 110A can be a stack including a dielectric layer (e.g., a ceramic material, such as, Al2O3 or AlN) 112 disposed between a first metal layer 111A (e.g., a copper metal) and a second metal layer 111B (e.g., a copper metal). Similarly, the second DBM substrate 110B can be a stack including a dielectric layer 114 disposed between a first metal layer 113A (e.g., a copper metal) and a second metal layer 131B (e.g., a copper metal). As shown in FIG. 2I, the first recess 146A of pillar 141C contacts a portion 115 of the dielectric layer 112 and the second recess 146B of pillar 141C contacts a portion 116 of the dielectric layer 114. Because the first and second recesses 146A, 146B of pillar 141C contact the respective dielectric layers 112, 114 of the first and second DBM substrates 110A, 110B, pillar 141C may have a height greater than some of the other pillars (e.g., pillars 141B and 141D).

In some implementations, for desirable adhesion and stability, an adhesive may be disposed between the first recess 146A of pillar 141C and the portion 115 of the dielectric layer 112 and between the second recess 146B of pillar 141C and the portion 116 of the dielectric layer 114. In some implementations, the recesses 146A, 146B may be around a respective perimeter of the DBM substrates 110A, 110B. In some implementations, the first recess 146A may be defined within the housing 100 such that each side (each of the 4 sides) of the DBM substrate 110A may be disposed with a side (within 4 sides) of the first recess 146A. The recesses 146A, 146B can surround, respectively, all or at least a portion of cavities 132, 134. Similarly, the second recess 146B may be defined within the housing 100 such that each side of the DBM substrate 110B may be disposed with a side of the second recess 146B.

In some implementations, the pillars 141A and 141E may contact the respective DBM substrates 110A, 110B in the similar manner as pillar 141C, as described above, except that pillars 141A and 141E contact only one side of the respective first and second DBM substrates 110A, 110B. More specifically, because pillars 141A, 141C and 141E have the same height (contacting the respective first and second DBM substrates 110A, 110B), pillars 141A and 141C define the first cavity 132 within the housing 100 and pillars 141E and 141C define the second cavity 134 within the housing 100. In other words, a perimeter of the first DBM substrate 110A surrounded (e.g., encased, bordered, walled, enclosed) by pillars 141A and 141C may define the first cavity 132. Similarly, a perimeter of the second DBM substrate 110B surrounded by pillars 141E and 141C may define the second cavity 134.

Figure 2J:
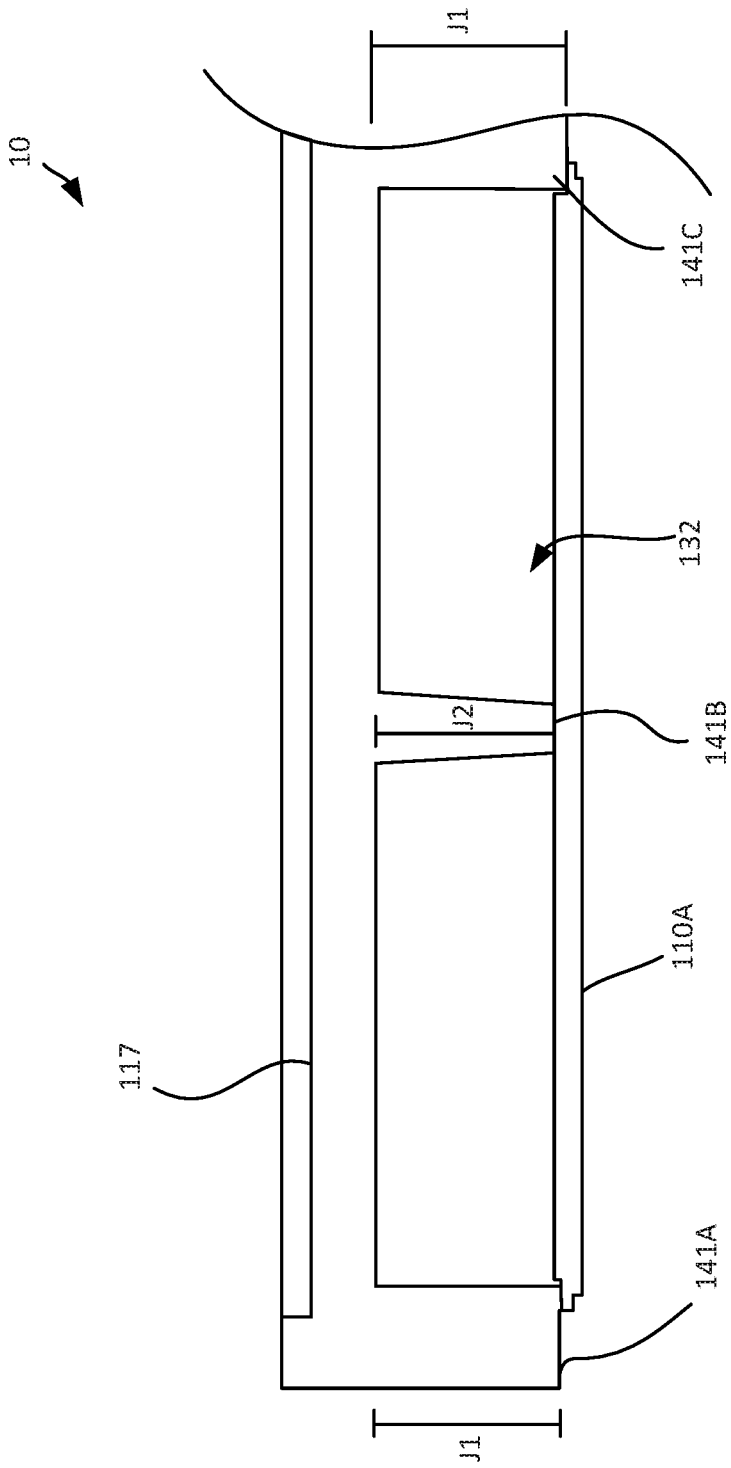
FIG. 2J is a portion view (left portion) of the electronic module of FIG. 2H.

FIG. 2J is a diagram that illustrates a view of the housing 100 associated with cavity 132. In some implementations, as shown in FIG. 2J, a height J1 of pillars 141A and 141C can be greater (e.g., taller) than a height J2 of pillar 141B because pillar 141B contacts a portion (top surface) of the first DBM substrate 110A while pillars 141A and 141C contact the portion 115 of the first DBM substrate 110A. Hence, pillars 141A and 141C can have heights greater than the height of pillar 141B.

Figure 2K:
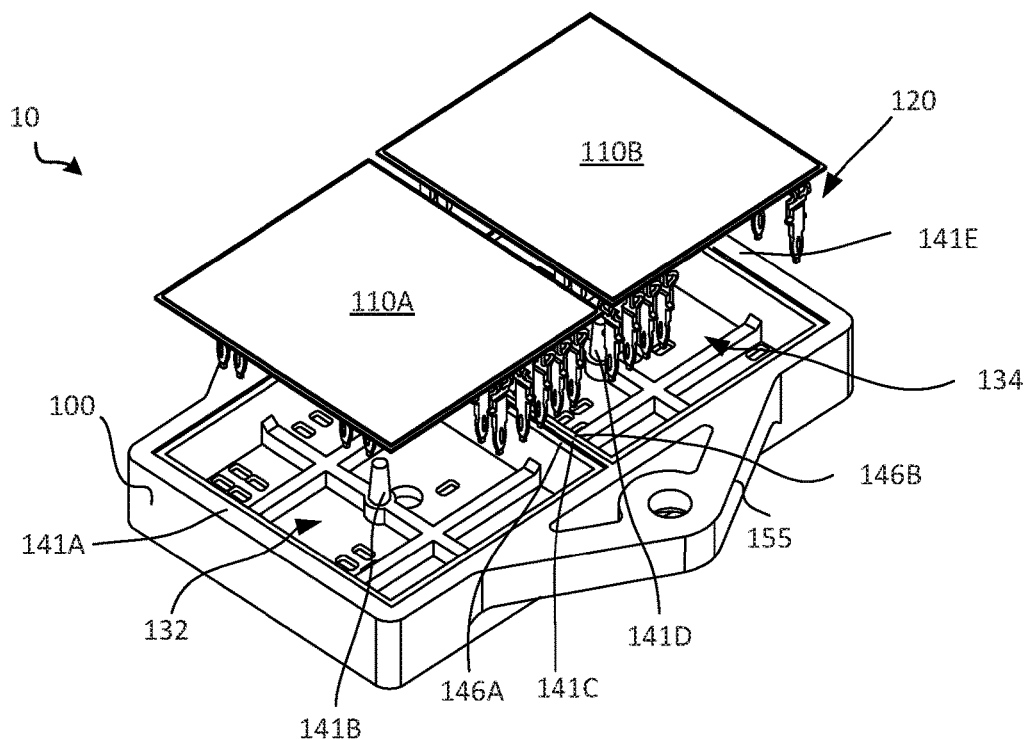

FIG. 2K illustrates a perspective view of an exploded view of the electronic module 10. The cavities 132, 134 and pillars 141B, 141D are shown in this view. As shown in FIG. 2K, the pillars 141A, 141E define walls of the housing 100. The pillar 141C defines a wall (e.g., an inner wall portion) within the housing 100. The pillar 141A (or wall portion) and the pillar 141C (or inner wall portion) are contiguous parts of the same wall that define the cavity 132. The pillar 141E (or wall portion) and the pillar 141C (or inner wall portion) are contiguous parts of the same wall that define the cavity 134. The pillar 141C has a first sidewall (on a first side) defining a portion of the cavity 132 and a second sidewall (on a second side) defining a portion of the cavity 134.

As shown in FIG. 2K, the pillar 141C includes a first recess 146A and a second recess 146B. The first recess 146A may be configured to receive a portion of the first DBM substrate 110A and the second recess 146B may be configured to receive a portion of the second DBM substrate 110B. The first recess 146A surrounds the cavity 132, and the second recess 146B surrounds the cavity 146B. Although not shown in FIG. 2K, the pillar 141C (or a portion thereof)

can be replaced by a bridge member, which is described in more detail below. The bridge member can include (or define) a portion of one or more recesses that surround one or more of the cavities (e.g., cavities 132, 134).

Figure 2L:
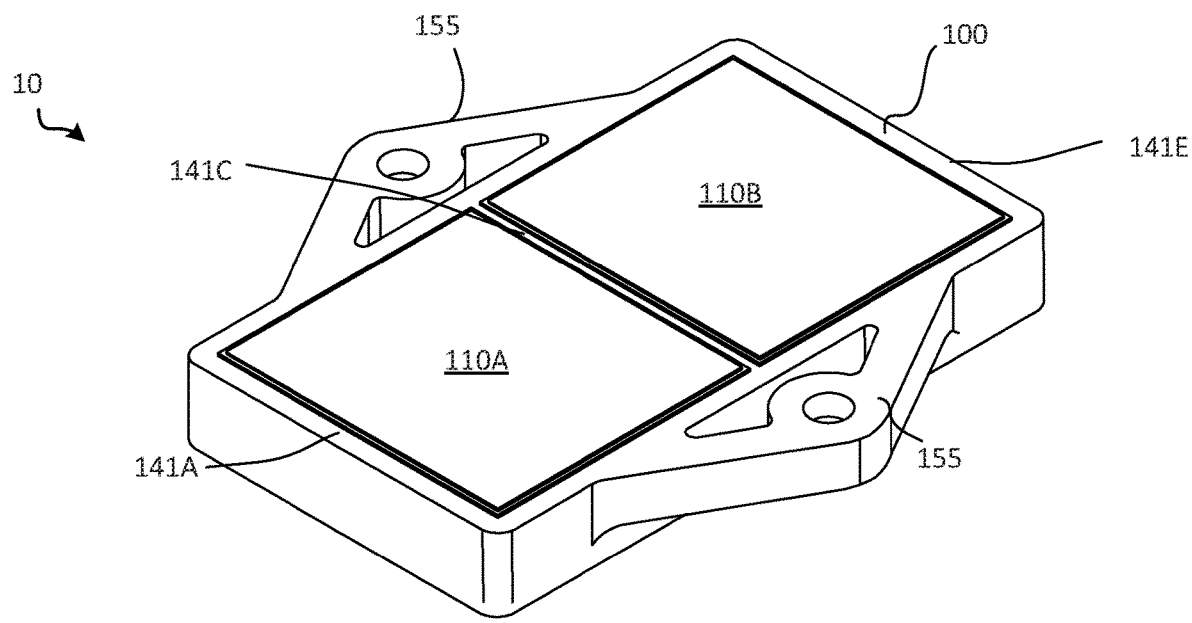
Figure 2M:
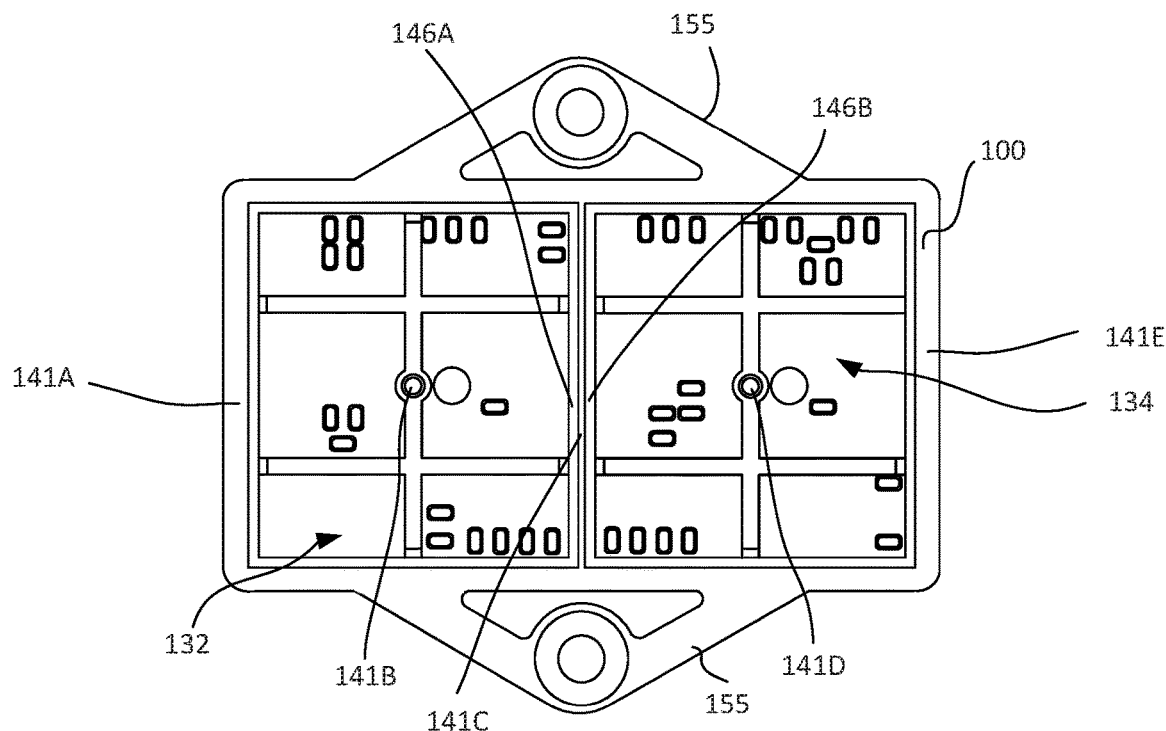
FIGS. 2M and 2N are perspective views of a housing.
Figure 2N:
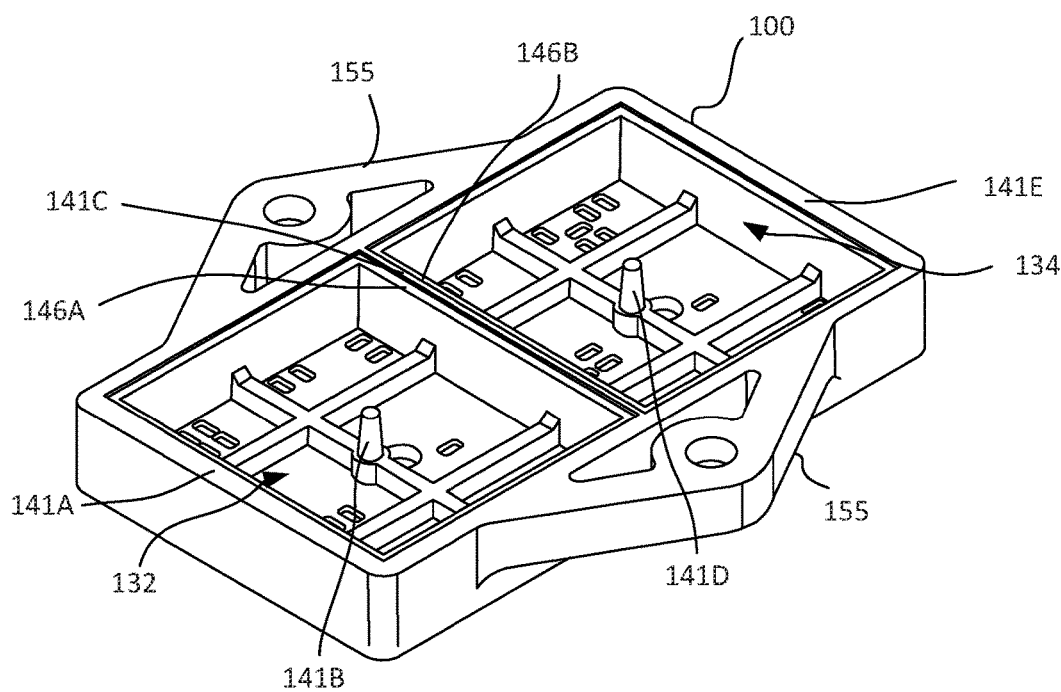

FIG. 2L illustrates the DBM substrates 110A, 110B coupled to the housing 100 (and coupled to (e.g., at least partially disposed within) the recesses 146A, 146B). FIGS. 2M and 2L are diagrams that illustrate views of the housing 100 and the cavities 132, 134 defined therein for the DBM substrates 110A, 110B.

Figure 3A:
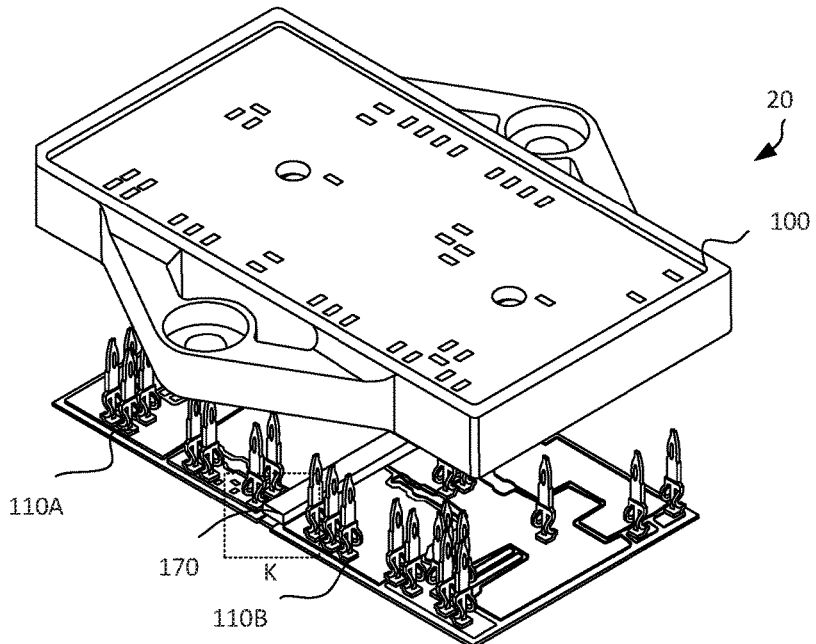
FIGS. 3A through 3H are views of another example of an electronic module according to another example implementation.
Figure 3B:
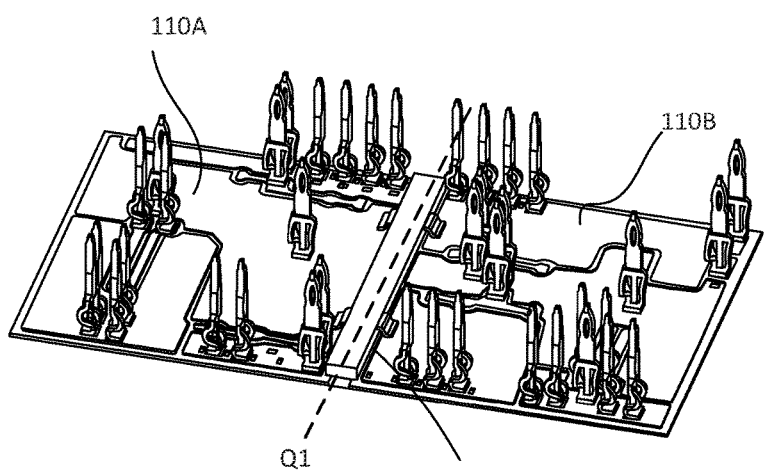
Figure 3C:
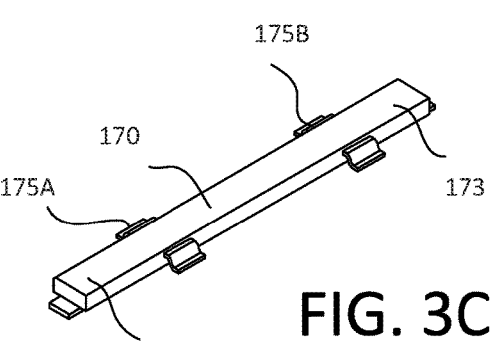
Figure 3D:
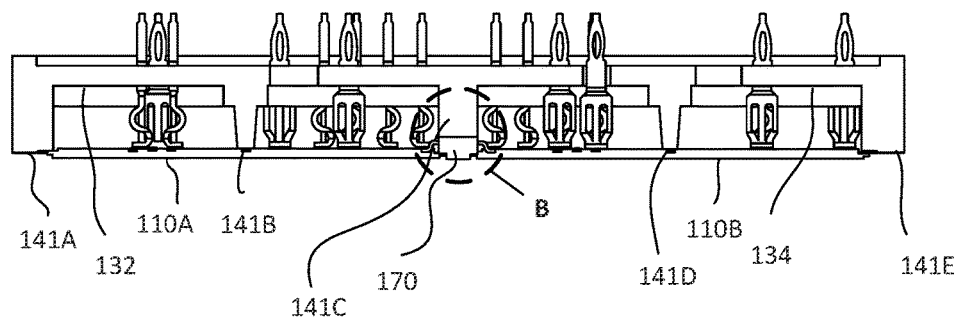
Figure 3E:
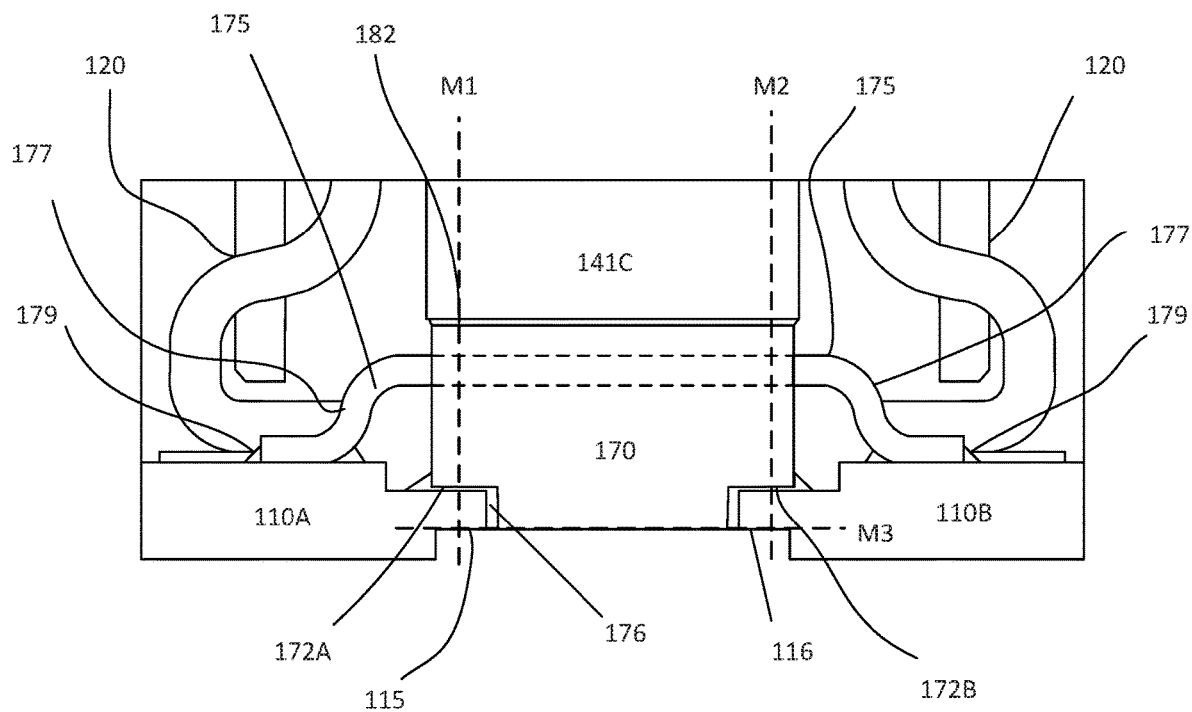

FIGS. 3A-3E illustrate an electronic module 20 according to another example implementations. FIG. 3A is a perspective view of the electronic module 20; FIG. 3B is a perspective view of DBM substrates 110A, 110B of FIG. 3A; FIG. 3C is a perspective view of a bridge member 170 of FIG. 3A; FIG. 3D is a cross sectional view of the electronic module 20 of FIG. 3A; and FIG. 3E is an enlarged view of an area associated with portion B shown in FIG. 3D.

Referring to FIG. 3A, the electronic module 20 may include the housing 100 and the first DBM substrate 110A and the second DBM substrate 110B. The electronic module 20 of FIG. 3A is similar to the electronic module 10 of FIG. 2A, except that the electronic module 20 of FIG. 3A includes the bridge member 170. Similar elements will not be further discussed in detail in this section to simplify the description.

Referring to FIG. 3B, the bridge member 170 is disposed between the first DBM substrate 110A and the second DBM substrate 110B. The bridge member 170 can be configured to support the first and second DBM substrates 110A, 110B. The bridge member 170 can obviate the need, in some implementations, for pillar 141C. In some implementations, the bridge member 170 may be disposed horizontally (e.g., laterally disposed) between at least a portion of the first DBM substrate 110A and the second DBM substrate 110B.

In some implementations, the bridge member 170 may have the same length (e.g., short side) as the first and second DBM substrates 110A, 110B. In other words, the bridge member 170 has a dimension or size to be disposed between (e.g., cover) an opening 190 located between the first and second DBM substrates 110A, 110B (as shown in FIG. 2F). More specifically, instead of pillar 141C being disposed between the opening 190 (as shown in FIG. 2I), the bridge member 170 can be disposed between the opening 190 located between the first and second DBM substrates 110A, 110B (as shown in FIG. 3E). In some implementations, the pillar 141C can be located above the bridge member 170.

The bridge member 170 has a longitudinal length aligned along line Q1, which can be orthogonal to a direction along which the DBM substrates 110A, 110B are aligned. The longitudinal length of the bridge member 170 can be aligned along a plane along which the DBM substrates 110A, 110B are aligned.

In some implementations, the bridge member 170 may be coupled to both the first DBM substrate 110A and the second DBM substrate 110B. In some implementations, the bridge member 170 may be coupled to the first DBM substrate 110A and the second DBM substrate 110B with an adhesive. For example, the coupling mechanisms (e.g., attachment mechanisms) can be, or can include, epoxy adhesive, solder, and/or so forth. The attachment mechanisms may be used for coupling (e.g., adhering) the bridge member 170 to the first DBM substrate 110A and/or the second DBM substrate 110B.

Figure 3F:
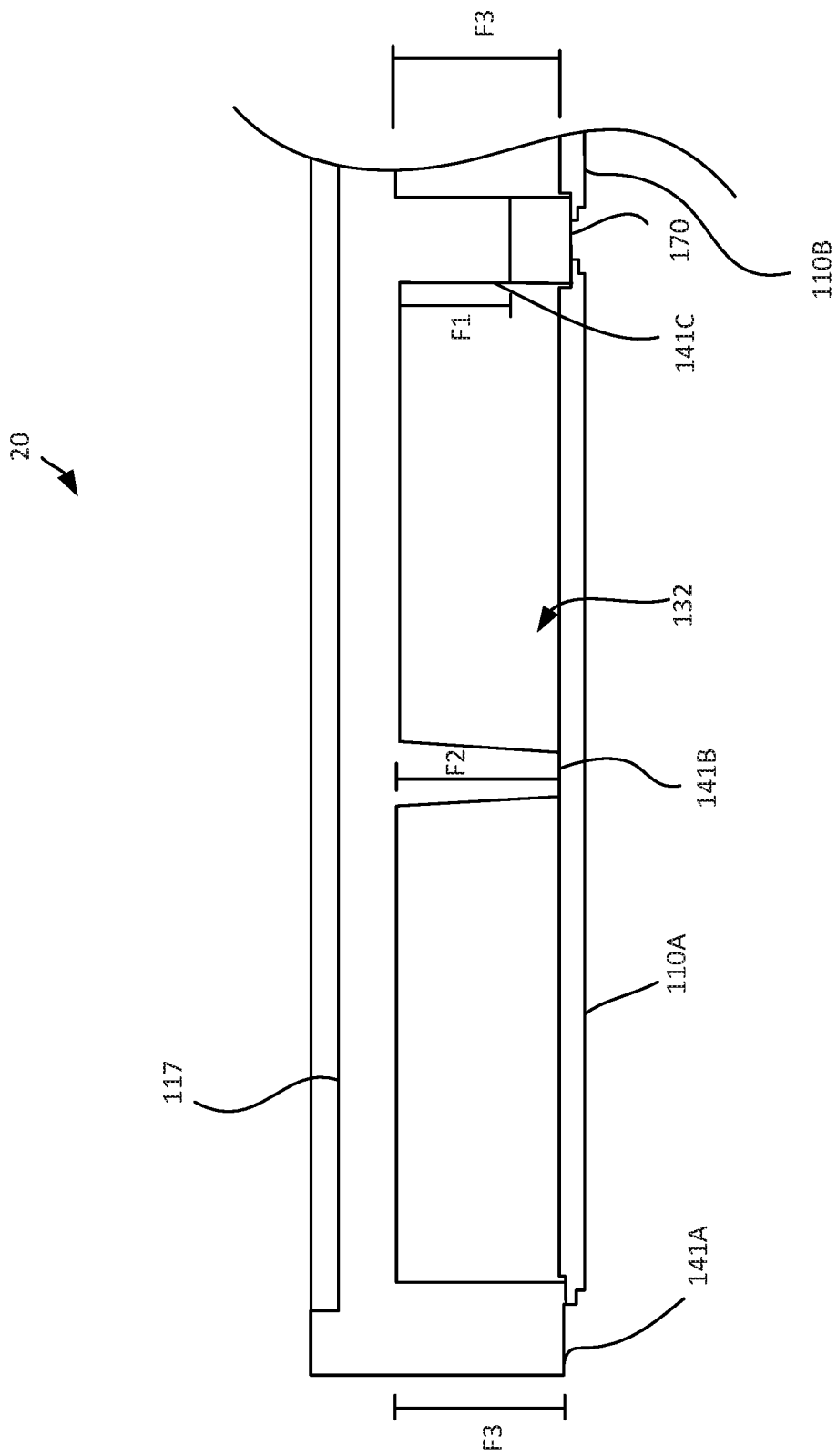

Referring to FIG. 3D, the housing 100 may include the plurality of pillars 141A, 141B, 141C, 141D and 141E extending (from an interior surface of the housing 100) toward the first DBM substrate 110A and the second DBM substrate 110B. In some implementations, some of the plurality of pillars 141A, 141B, 141D, 141E may be in contact with the first and second DBM substrates 110A, 110B. In some implementations, pillars 141A and 141B may contact the first DBM substrate 110A and pillars 141D and 141E may contact the second DBM substrate 110B. Pillar 141C may contact the bridge member 170. Because pillar 141C contacts the bridge member 170, pillar 141C may be shorter than pillars 141A, 141B, 141D, 141E. For example, as shown in FIG. 3F, pillar 141C can be the shortest pillar (as indicated by height F1) because pillar 141C contacts (e.g., supported by) the bridge member 170. Pillar 141B (and 141D) can be the next shortest pillar (as indicated by height F2) because pillar 141B contacts a portion (top surface) of the first DBM substrate 110A. In other words, pillar 141B is longer than pillar 141C. Pillar 141A (and pillar 141E) can be the longest pillar (as indicated by height F3) because pillar 141A contacts the portion 115 of the first DBM substrate 110A. Hence, pillar 141A can be the tallest pillar as compared to the heights of pillars 141B and/or 141C.

In some implementations, pillars 141A, 141B, 141C, 141D and 141E may be coupled to the first DBM substrate 110A, the second DBM substrate 110B and/or the bridge member 170 with a coupling mechanism such as an adhesive.

Referring to FIG. 3E, which is an enlarged view of the area associated with portion B shown in FIG. 3D, pillar 141C may contact a surface (e.g., upper surface) of the bridge member 170. In some implementations, pillar 141C may be coupled to (in contact with, attached to) the bridge member 170 with a coupling mechanism such as an adhesive 182. In some implementations, the adhesive 182 can be excluded. In some implementations, the bridge member 170 may be disposed vertically between the pillar 141C and at least a portion of the first DBM substrate 110A and/or the second DBM substrate 110B (as shown along lines M1 and M2).

In some implementation, the bridge member 170 may contact the first DBM substrate 110A and the second DBM substrate 110B. In some implementations, the bridge member 170 may include a first recess 172A and a second recess 172B. The first recess 172A may be configured to receive a portion 115 of the first DBM substrate 110A and the second recess 172B may be configured to receive a portion 116 of the second DBM substrate 110B. In some implementations, one or more of the recesses 172A, 172B can be configured to receive different portions (different than 115, 116) (e.g., metal portions) of DBM substrates 110A, 110B. As previously discussed, the recesses 172A, 172B of the bridge member 170 may contact a dielectric layer portion (which corresponds with portions 115 and 116) of the first DBM substrate 110A and the second DBM substrate 110B.

In some implementations, the first recess 172A and the second recess 172B can be on opposite sides of the bridge member 170. In some implementations, the first recess 172A can be aligned parallel to the second recess 172B along a longitudinal length of the bridge member 170.

In some implementations, the first DBM substrate 110A and the second DBM substrate 110B may be coupled to the respective recesses 172A, 172B of the bridge member 170 with adhesive 176 for greater adherence and stability. The adhesive 176 can be excluded from some implementations.

Referring back to FIG. 3C, the bridge member 170 may include a contact member 175 extending from side portions of the bridge member. The contact member 175 may be configured to electrically connect the first DBM substrate 110A and the second DBM substrate 110B together. For example, the contact member 175 provides electrical contact with a metal layer (e.g., copper layer) of the first DBM substrate 110A and a metal layer (e.g., copper layer) of the second DBM substrate 110B.

In some implementations, the contact member 175 may be disposed within the bridge member 170. In other words, the contact member 175 may extend through the bridge member 170. In one implementation, one end of the contact member 175 may be coupled (e.g., electrically coupled, attached) to the first DBM substrate 110A, extend through the bridge member 170, and the other end of the contact member 175 may be coupled to the second DBM substrate 110B.

In some implementations, the contact member 175 may be coupled (e.g., attached) to the first DBM substrate 110A and the second DBM substrate 110B with a conductive element 179 such as a solder, a conductive epoxy, and/or so forth.

As shown in FIG. 3E, the bridge member 170 can have a surface that is aligned along a surface of the DBM substrates 110A, 110B (aligned along plane M3). Specifically, the bridge member 170 can have a surface that is aligned along a surface of dielectric layers the DBM substrates 110A, 110B.

As shown in FIG. 3C, the bridge member may include two contact members 175 extending therethrough and attached to the first DBM substrate 110A and the second DBM substrate 110B. In some implementations, a contact member 175A may be disposed near one (or within) an end portion 171 of the bridge member 170 and a contact member 175B may be disposed near (or within) another end portion 173 of the bridge member 170. In some implementations, end portion 171 may be opposite to end portion 173. In some implementations, there may be more or less than two contact members 175 extending through the bridge member 170 and attached to the first DBM substrate 110A and the second DBM substrate 110B.

In some implementations, the contact member 175 may be made from a conductive material such as a metal (e.g., copper). Other suitable metals and/or materials used for electrical connection may be used.

In some implementations, the contact member 175 may have a curved portion 177 that extends downward towards the first DBM substrate 110A and the second DBM substrate 110B. The curved portion 177 can be configured to reduce stress placed on the contact member 175.

In some implementations, the bridge member 170 can be made from a plastic (e.g., a high temperature plastic). For example, the plastic can be made of a molding compound or other material that can withstand a reflow temperature of several hundred degrees (e.g., around 260 degree C. for 10 minutes).

Figure 3G:
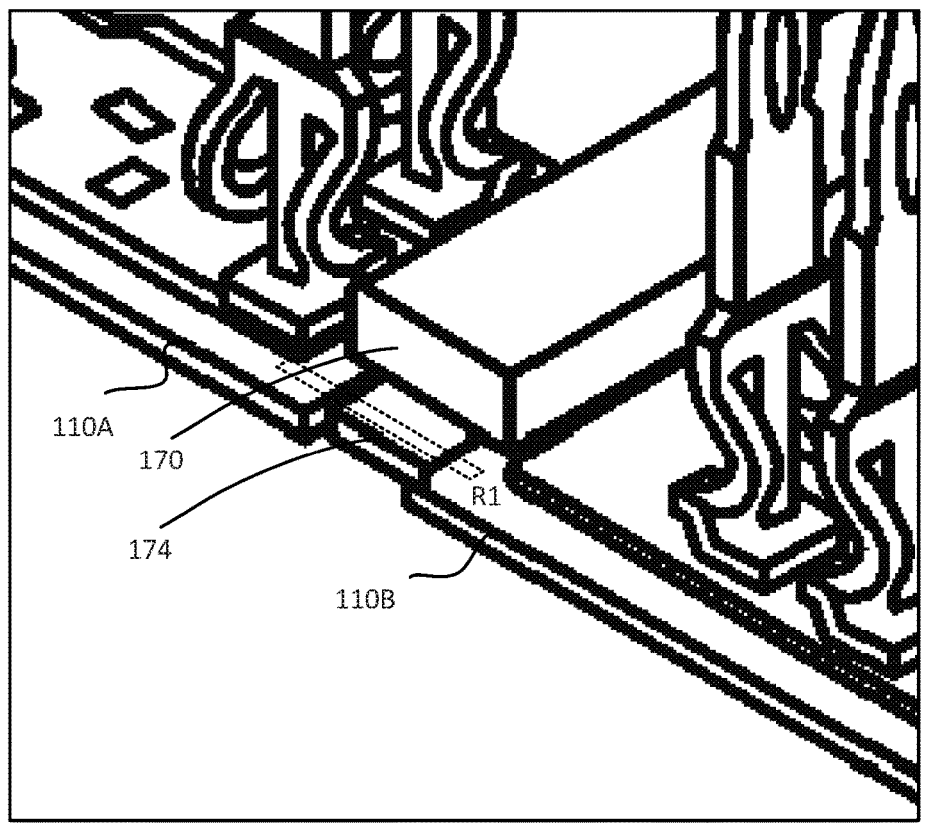

As shown in FIG. 3G, illustrates a zoomed in portion K of the bridge member 170 and electronic module 20. As shown in FIG. 3G, the bridge member 170 has an extension portion 174. The extension portion 174 has a surface that is aligned along a surface of the DBM substrates 110A, 110B (aligned along plane R1). Specifically, the extension portion 174 of the bridge member 170 can have a surface that is aligned along a surface of dielectric layers the DBM substrates 110A, 110B. The extension portion 174 and the portions of the DBM substrates 110A, 110B (that are aligned on the same plane) can be configured to be disposed within a recess (e.g., a single recess) of the housing 100 when coupled to the housing 100. The bridge member 170 and the DBM substrates 110A, 110B can define a sub-assembly (e.g., a bridge-substrate sub-assembly).

Figure 3H:
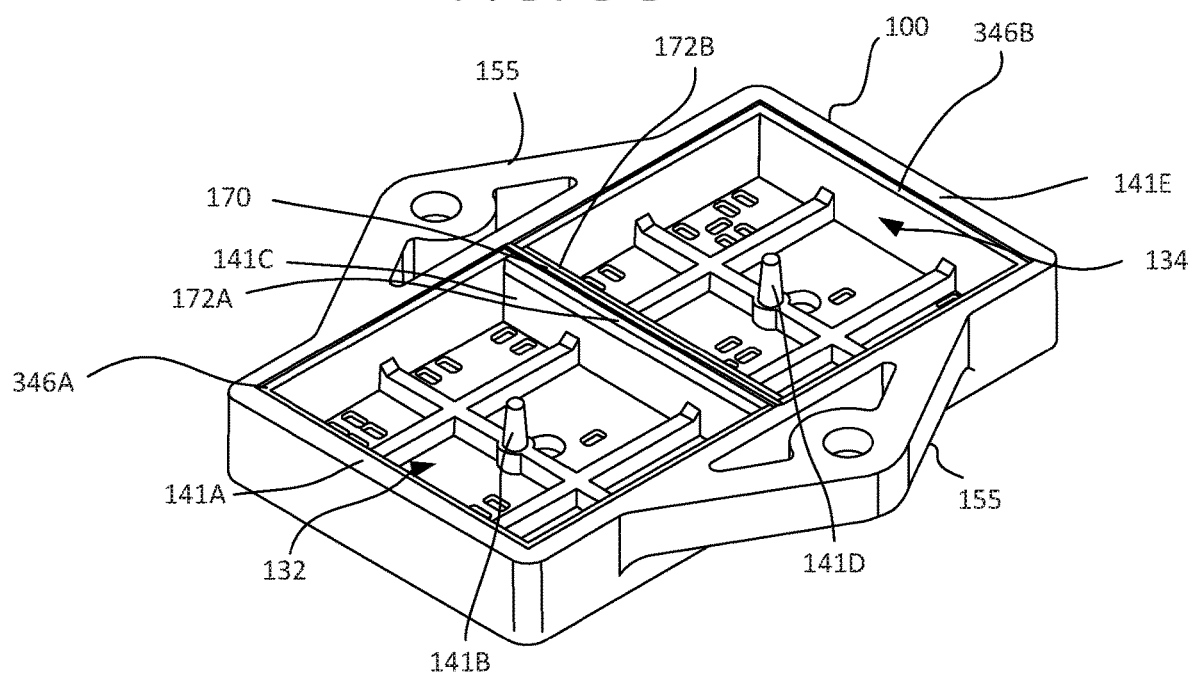

FIG. 3H is a diagram that illustrates a view of the housing 100 and the cavities 132, 134 defined therein for the DBM substrates 110A, 110B. FIG. 3H illustrate the bridge member 170 disposed on the pillar 141C. The bridge member 170 includes (or defines) recesses 172A, 172B that are contiguous with portions of recesses 346A, 346B that surround the cavities 132, 134. The contact members 175 are not shown in this view.

Figure 4A:
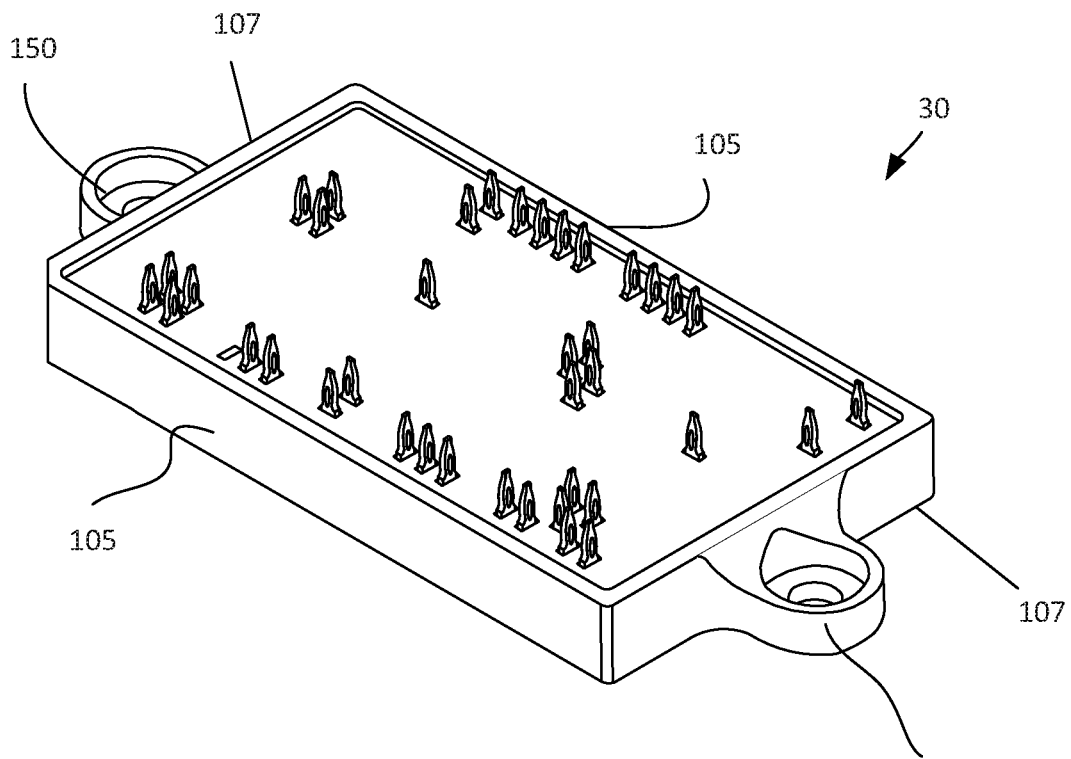
FIGS. 4A and 4B illustrate an electronic module according to another example implementation.
Figure 4B:
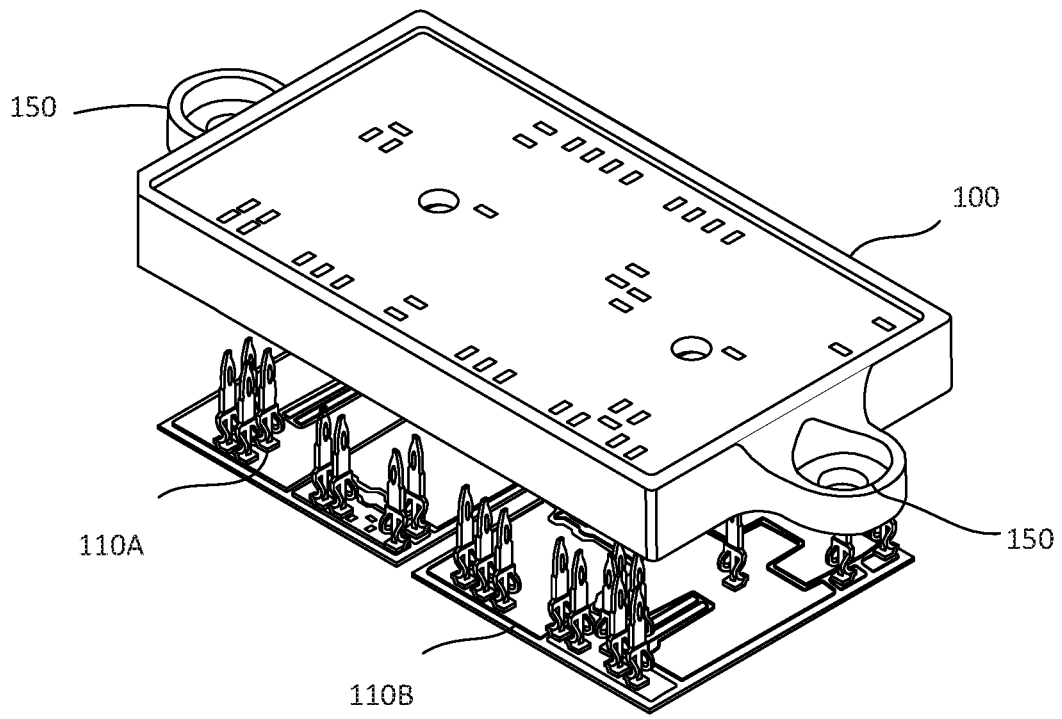

FIGS. 4A and 4B illustrate an electronic module 30 according to some example implementations. The electronic module 30 of FIGS. 4A and 4B is similar to the electronic module 10 of FIG. 2A, except that a countersink hole 150 is located at a different location. More specifically, the countersink hole 150 can be located at one end sidewall (e.g., shorter side) 107 of the housing 100. In some implementations, the countersink hole 150 may be located at both end sidewalls 107 of the housing 100. The countersink hole 150 may be integrally molded with the housing 100.

In some implementations, other substrates may be used instead of a DBM, such as, for example, direct bonded aluminum (DBA) substrates, active metal brazing (AMB) substrates, etc. In some implementations, an electronic module may include three or more DBM substrates. The three or more DBM substrates can have the size and functionality to fit within a housing of the electronic module.

In some implementations, a heat sink may be attached to the electronic module. The heat sink may be used to dissipate heat away from the electronic module. In some implementations, the heat sink may be made from a thermally conductive material such as copper, aluminum, and/or so forth.

In some implementations, a highly thermal conductive silicon grease may be applied to the DBM substrate. In one implementation, the silicon grease may be applied between the DBM substrate and a heat sink. In some implementations, the silicon grease may be applied to one surface of the DBM substrate. In some implementations, the silicon grease may be applied to an entire surface of the DBM substrate that is attached to a baseplate and/or a heat sink.

Figure 5:
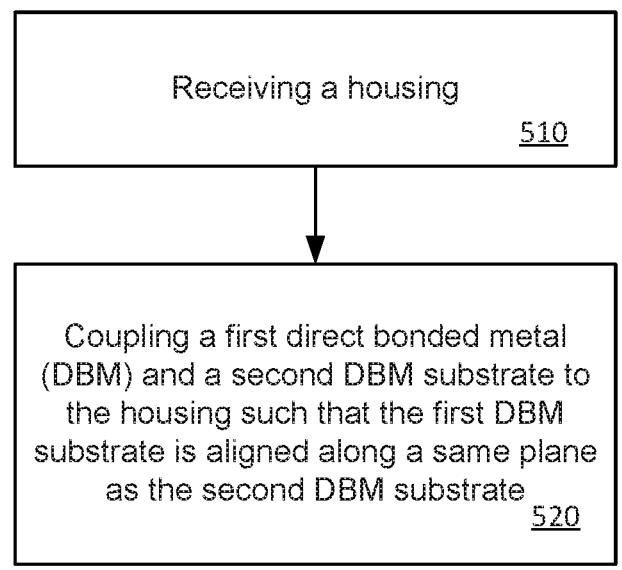
FIG. 5 is a diagram that illustrate a method for producing one or more of the electronic modules described herein.

FIG. 5 is a diagram that illustrate a method for producing one or more of the electronic modules described herein. FIG. 5 illustrates receiving a housing (block 510) and a first DBM substrate and a second DBM substrate are coupled to the housing such that the first DBM substrate and the second DBM substrate are aligned along a same plane (block 520) In some implementations, the first DBM substrate (or edges thereof, or a perimeter thereof) can be disposed within a first recess defined within the housing. The second DBM substrate (or edges thereof, or a perimeter thereof) can be disposed within a second recess defined within the housing. The first recess can be separate from the second recess.

In some implementations, the method can include moving a connection terminal from a plurality of terminals coupled to at least one of the first DBM substrate and the second DBM substrate through an opening from a plurality of openings defined within the housing member.

In some implementations, the method can include coupling a bridge member to the housing. The bridge member can include a first recess and a second recess. The first recess can be configured to receive a portion (e.g., dielectric layer, metal layer) of the first DBM substrate and the second recess can be configured to receive a portion (e.g., dielectric layer, metal layer) of the second DBM substrate. In some implementations, the method can include electrically coupling a dielectric layer and/or a metal layer of the first DBM substrate to a recess of the bridge member. In some implementations, a first end of the bridge member and a second end of the bridge member can be disposed within a recess of the housing.

In some implementations, the method can include electrically coupling a bridge member to the first DBM substrate and the second DBM substrate (as shown in FIG. 3B) prior to coupling the first DBM substrate and the second DBM substrate to the housing. In such implementations, the bridge member and the DBM substrates (which are coupled to the bridge member) can define a sub-assembly that can be coupled to the housing. At least a perimeter portion of the sub-assembly can be disposed within a recess (e.g., a single recess) within the housing (e.g., a recess around a perimeter of the housing). In some implementations, the sub-assembly including the bridge member and at least two substrates can be disposed within a single recess within the housing.

As described herein, coupling, attaching or bonding may referred to gluing, soldering, welding, or sintering, or other types of attachment.

Specific structural and functional details disclosed herein are merely representative for purposes of describing example embodiments. Example embodiments, however, be embodied in many alternate forms and should not be construed as limited to only the embodiments set forth herein.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Galium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An electronic module, comprising:
a first direct bonded metal (DBM) substrate;
a second DBM substrate, the first DBM substrate and second DBM substrate being aligned along and disposed within a same plane;
a housing member coupled to the first DBM substrate and the second DBM substrate, the housing member defining a cavity and including a plurality of openings into the cavity via a surface of the housing member; and
a plurality of connection terminals electrically coupled to at least one of the first DBM substrate and the second DBM substrate, a connection terminal from the plurality of terminals extending through the cavity and an opening from the plurality of openings of the housing member.

2. The module of claim 1, wherein the housing member includes:
a first pillar disposed within the cavity and in contact with a metal layer of the first DBM substrate; and
a second pillar disposed within the cavity and in contact with a dielectric layer of the first DBM substrate, the first pillar having a length shorter than a length of the second pillar, the first pillar being aligned along a direction perpendicular to the surface of the housing member.

3. The module of claim 1, further comprising:
a pillar disposed within a cavity of the housing member; and
a bridge member being vertically disposed between the pillar and both of the first substrate and the second substrate, the bridge member being disposed horizontally between the first substrate and the second substrate.

4. The module of claim 1, further comprising:
a bridge member,
the housing member includes:
a first pillar disposed within the cavity and in contact with a metal layer of the first DBM substrate; and
a second pillar disposed within the cavity and in contact with the bridge member, the second pillar having a length shorter than the first pillar.

5. The module of claim 1, further comprising:
a pillar disposed within a cavity of the housing member and being adhesively coupled to a portion of the first DBM substrate.

6. The module of claim 1, further comprising:
a bridge member including a first recess and a second recess, the first recess configured to receive a portion of the first DBM substrate and the second recess configured to receive a portion of the second DBM substrate.

7. The module of claim 1, further comprising:
a bridge member including a contact member extending on at least one side portion of the bridge member.

8. The module of claim 1, further comprising:
a bridge member including a contact member disposed within the bridge member and electrically in contact with a metal layer of the first DBM substrate and the metal layer of the second DBM substrate.

9. The module of claim 8, wherein the contact member is soldered to the metal layer of the first substrate and to the metal layer of the second substrate.

10. The module of claim 1, wherein the first DBM substrate and the second DBM substrate are each a direct bonded copper (DBC) substrate.

11. A module, comprising:
a first direct bonded metal (DBM) substrate;
a second DBM substrate, the first DBM substrate and second DBM substrate being aligned along a same plane;
a housing member coupled to the first DBM substrate and the second DBM substrate, the housing member including a plurality of openings in a surface of the housing member; and
a plurality of connection terminals electrically coupled to at least one of the first DBM substrate and the second DBM substrate, a connection terminal from the plurality of terminals extending through an opening from the plurality of openings of the housing member, the housing member including a pillar within a cavity of the housing member, the pillar being in contact with the first DBM substrate.

12. An electronic module, comprising:
a first direct bonded metal (DBM) substrate;
a second DBM substrate, the first DBM substrate and the second DBM substrate being aligned along a same plane;
a bridge member disposed between the first DBM substrate and the second DBM substrate, the bridge member includes a first recess and a second recess, the first recess configured to receive a portion of the first DBM substrate and the second recess configured to receive a portion of the second DBM substrate; and
a housing member coupled to the first substrate, the second substrate, and the bridge member.

13. The module of claim 12, wherein the first recess of the bridge member is in contact with a dielectric layer of the first DBM substrate and the second recess of the bridge member is in contact with a dielectric layer of the second DBM substrate.

14. The module of claim 12, further comprising:
a pillar disposed within a cavity of the housing member and being coupled to a portion of the bridge member.

15. The module of claim 14, wherein the bridge member is disposed vertically between the pillar and at least a portion of the first DBM substrate and the second DBM substrate.

16. The module of claim 12, wherein the bridge member includes a first contact member disposed at a first end portion of the bridge member and a second contact member disposed at a second end portion of the bridge member, the second end portion being opposite the first end portion.

17. A method comprising,
receiving a housing defining at least a portion of a cavity; and
coupling a first DBM substrate and a second DBM substrate to the housing such that the first DBM substrate and the second DBM substrate are aligned along a same plane and such that a connection terminal from a plurality of connection terminals coupled to at least one of the first DBM substrate and the second DBM substrate are extended through the cavity and through an opening from a plurality of openings defined within the housing and exposed to the cavity, the connection terminal being aligned perpendicular to the same plane and the first and second DMB substrates.

18. The method of claim 17, further comprising:
coupling a bridge member to the housing, the bridge member including a first recess and a second recess, the first recess being configured to receive a portion of the first DBM substrate and the second recess being configured to receive a portion of the second DBM substrate.

19. The method of claim 17, further comprising:
coupling a bridge member to the housing; and
electrically coupling at least one of a dielectric layer or metal layer of the first DBM substrate to a recess of the bridge member.

20. The method of claim 17, further comprising:
electrically coupling a bridge member to the first DBM substrate and the second DBM substrate prior to coupling the first DBM substrate and the second DBM substrate to the housing.

* * * * *